(12) United States Patent
Berezin

(10) Patent No.: US 6,677,873 B2
(45) Date of Patent: Jan. 13, 2004

(54) OVERSAMPLED CENTROID A TO D CONVERTER

(75) Inventor: Vladimir Berezin, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/241,419

(22) Filed: Sep. 10, 2002

(65) Prior Publication Data

US 2003/0011501 A1 Jan. 16, 2003

Related U.S. Application Data

(63) Continuation of application No. 09/430,625, filed on Oct. 29, 1999, now Pat. No. 6,448,912.
(60) Provisional application No. 60/106,490, filed on Oct. 30, 1998.

(51) Int. Cl.[7] .................................................. H03M 1/20
(52) U.S. Cl. ........................ 341/131; 341/156; 358/500
(58) Field of Search .................................. 341/143, 141, 341/162, 172, 131, 155, 156; 348/234, 308, 315; 382/323, 203; 358/500; 380/269; 708/313

(56) References Cited

U.S. PATENT DOCUMENTS

| | | | | |
|---|---|---|---|---|
| 4,574,311 A | * | 3/1986 | Resnikoff et al. ............ 348/315 |
| 5,010,347 A | * | 4/1991 | Yukawa ....................... 341/143 |
| 5,077,810 A | * | 12/1991 | D'Luna ........................ 382/323 |
| 5,124,706 A | * | 6/1992 | Gerdes ........................ 341/156 |
| 5,255,081 A | * | 10/1993 | Miyamoto et al. |
| 5,477,345 A | * | 12/1995 | Tse .............................. 358/500 |
| 5,659,315 A | * | 8/1997 | Mandl .......................... 341/143 |
| 5,717,618 A | * | 2/1998 | Menkhoff et al. ........... 708/313 |
| 5,796,869 A | * | 8/1998 | Tsuji et al. ................... 382/203 |
| 6,377,303 B2 | * | 4/2002 | O'Connor .................... 348/308 |
| 6,400,824 B1 | * | 6/2002 | Mansoorian et al. ........ 380/269 |

* cited by examiner

Primary Examiner—Jean Bruner Jeanglaude
(74) Attorney, Agent, or Firm—Dickstein Shapiro Morin & Oshinsky LLP

(57) ABSTRACT

An analog to digital converter oversamples an image signal, and uses the oversampled information to obtain additional resolution. The analog to digital converter is included in an image sensor device having a photosensor array of photosensitive of pixels and a plurality of analog to digital converters. Each of the analog to digital converters is adapted to produce a digital output with a first specified bit resolution. An interpolator is adapted to receive an output thus produced from an analog to digital converter and produce a digital output with a second specific bit resolution.

43 Claims, 2 Drawing Sheets

OVERSAMPLED CENTROID A TO D CONVERTER

CROSS-REFERENCE TO RELATED APPLICATIONS

This application is a continuation application of and claims priority to U.S. application Ser. No. 09/430,625, filed on Oct. 29, 1999, now U.S. Pat. No. 6,448,912 which claims priority to U.S. application Ser. No. 60/106,490, filed Oct. 30, 1998.

BACKGROUND

An active pixel sensor typically takes the form shown in FIG. 1. A photosensor array 101 is disposed on a single chip substrate 100 with a number of columns 102 and rows 104. Each pixel has a photoreceptor 122, a follower transistor 124, and a selection transistor 126.

The pixels from the photosensor are coupled to one or more analog to digital converters 110 which convert the analog information 106 from the sensor 100 into digital output information 112. The analog to digital converters 110 are typically on the same substrate 100 with the image sensor 100. In a particularly preferred architecture, as shown, one analog to digital converter is associated with each column of the array. This system operates in column-parallel mode. At each clock cycle, an entire row of information is simultaneously output from the bank of analog to digital converters. The accuracy of the output image, which is collectively obtained from the output of all the analog to digital converters, is therefore dependent on the accuracy of the analog to digital converters. These devices, however, are limited in size. They must fit on the substrate. They also need to be relatively fast to maintain the processing speed.

SUMMARY OF THE INVENTION

The present invention teaches a system of introducing statistical processing into the A/D converters in order to improve the overall image quality. This is done according to the present invention by using A/D converters that are configured to oversample the input signal, find a centroid of the oversampled signal, and use the oversampling to enhance the accuracy.

The ADCs can operate with fewer bits than required for the total output, since oversampling is carried out.

BRIEF DESCRIPTION OF THE DRAWINGS

These and other aspects of the invention will be described in detail with reference to the accompanying drawings, wherein.

DETAILED DESCRIPTION OF THE PREFERRED EMBODIMENTS

Figure 1:
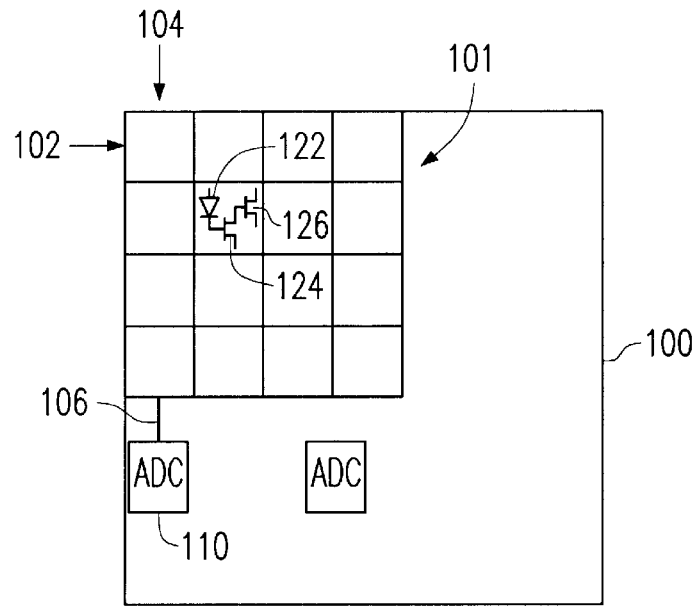
FIG. 1 shows an active pixel sensor block diagram.
Figure 2:
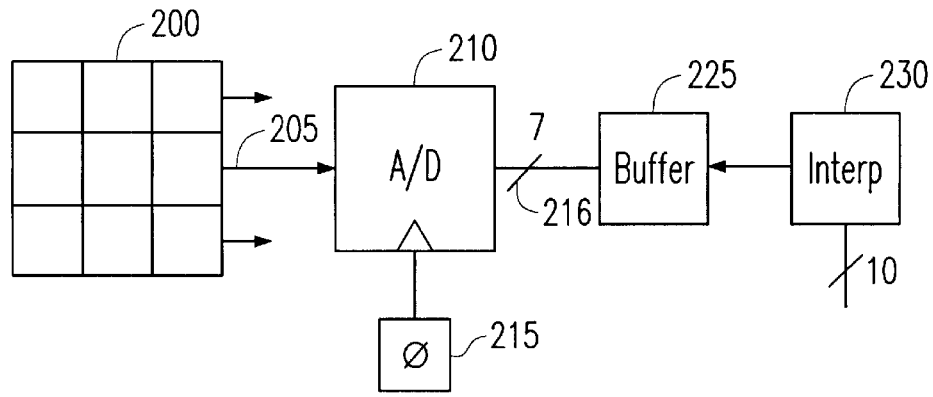
FIG. 2 shows a block diagram of the oversampling operation.

An embodiment is shown in FIG. 2. A photosensor array 200 can be for example, an active pixel sensor of the type described above and as described in U.S. Pat. No. 5,471,515, and shown in FIG. 1. The sensor is arranged to produce output signals 205. One output signal can be produced at any one time using a fast A to D converter, such as a flash type ADC, or output signals can be produced in a column-parallel manner.

Each output signal such as 205 is coupled to an A to D converter 210. The A to D converter 210 has a specified resolution, e.g. a resolution less than that desired for the total output.

In this embodiment, A to D converter 210 has a resolution of 7 bits shown as the output 216. The A to D converter is driven by a clock 215 which operates at frequency faster than the production of signal 205. For example, the clock may operate 16 times faster or 64 times faster than the speed at which the output signal 205 is produced. Therefore, each output signal, for example, is oversampled by 16 times or 64 times.

The results are stored in buffer 225, operated on by interpolator 230. Interpolator effectively averages the values in the buffer 225 so that the noise that is mixed with the signal is effectively averaged out. The averaged signal therefore has improved accuracy.

Moreover, since the number of bits needed for actual accuracy of the A/D converter is reduced, the A/D converter 210 can be made smaller and faster. According to a preferred embodiment, a 16 times oversampling is used to obtain three extra bits of image quality. In addition, image quality is increased by lower quantization distortion, and lower quantizing distortion. Dithering can also be used to improve the contouring.

An embodiment can use a 7 bit A/D converter, which is driven by the clock to oversample by sixteen times (16×).

The interpolator 230 is a standard digital interpolator as known in sigma delta A/D converters, for example. The 16 times oversample is interpolated to produce a 10-bit output at 235. An important advantage is that since the A/D converter 210 operates with fewer bits, it can be a successive approximation A/D converter which can operate with smaller capacitors.

By using smaller capacitors, the amount of real estate on the chip substrate is decreased. In addition, the smaller capacitors take less time to charge. Since less space is taken up by the A to D converter, the ratio of the digital area to the analog area of the chip is increased. This helps to make the overall design more scalable to smaller CMOS features.

Figure 3:
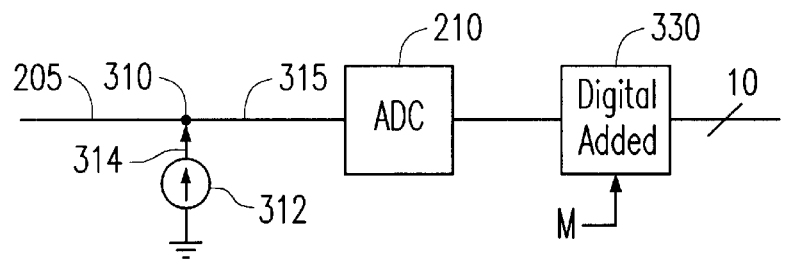
FIG. 3 shows a block diagram of another system using random noise addition.

Another embodiment is shown in FIG. 3. The analog signal 205 is connected to an analog adder 310 (e.g., a node) where it is added to noise produced by noise generator 312. The bias signal 314 applied to the adder 310 can be a representation of the noise in the system, to cancel out some of that noise. The level-adjusted analog signal 315 is then coupled to 7 bit A to D converter 210, which has a least significant bit resolution of 8 millivolts.

The output signal is coupled to a digital adder 330 which adds the output sample to previous samples. M samples are added, where here M can equal 16. The digital adder produces a digital output of N=10 bits, with the least significant bit (LSB)=1 millivolt.

This bias input 312 can be a bias level, or can be random noise with an RMS equal to half the value of the least significant bit.

The present system has described M=16 in order to obtain three additional bits of resolution. More generally, the number of required summations may be obtained from the equation for desired Dynamic Range Extension:

$$D = \log_2(2 \cdot \sqrt{M}) = 1 + 0.5 \cdot \log_2 M$$

The most reasonable selection for the standard TV application could be 3-bits, requiring 16 summations.

Other possible values are:

| M | D, bit |
|---|---|
| 8 | 2.5 |
| 16 | 3 |
| 32 | 3.5 |
| 64 | 4 |

Figure 4A:
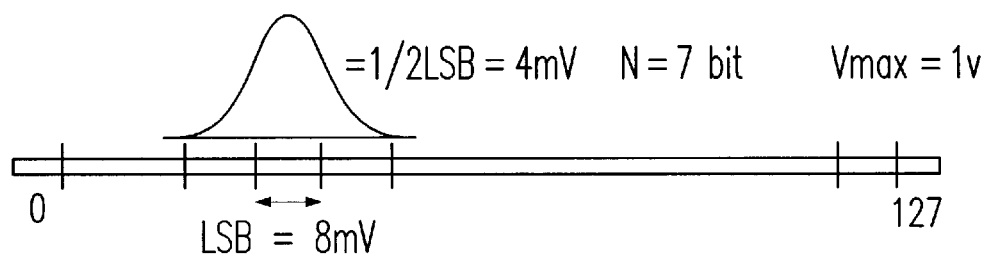
FIGS. 4a–4C illustrate the operation.
Figure 4B:
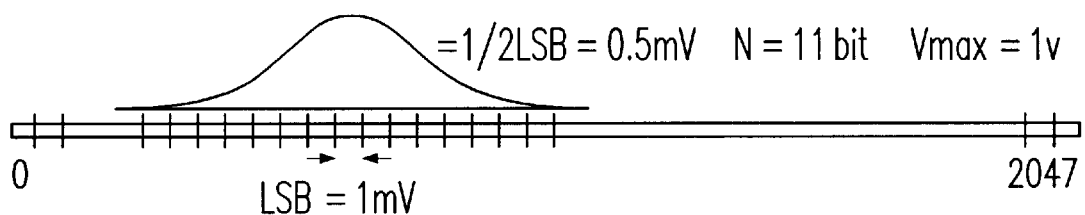
Figure 4C:
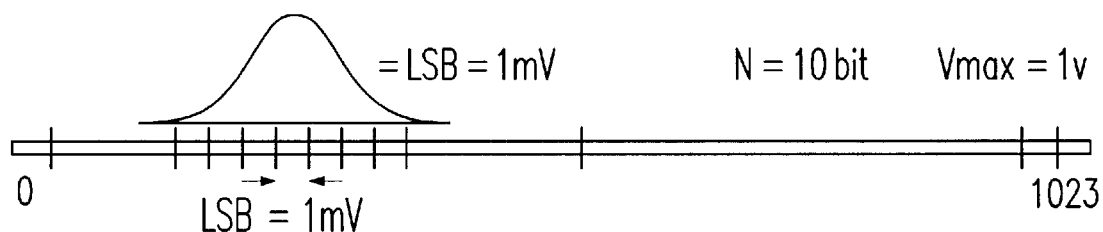

FIGS. 4A–4C show the operation of the oversampling centroid A to D converter. FIG. 4A shows the initial distribution, where the half LSB equals 4 millivolts. After 16 summations, the least significant bit is one millivolt, but the values have changed, as shown in FIG. 4B. FIG. 4C shows shifting right by one bit to produce the final output.

Quantizing distortion is often visible as contouring. The quantizing distortion is often countered by a technique called dither. Dither adds white noise to the signal. However, this dither reduces the signal to noise ratio.

Other embodiments are within the disclosed embodiment.

What is claimed is:

1. An image sensor comprising:
    a photosensor array having an array of photosensitive pixels;
    at least a plurality of analog to digital converters integrated on a common substrate with said photosensor array, each having a digital output having a first specified bit resolution; and
    an interpolator integrated on said common substrate, receiving outputs from said analog to digital converters, and producing a digital output having a second specified bit resolution.

2. A sensor as in claim 1, wherein said second specified bit resolution is larger than said first specified bit resolution.

3. A sensor as in claim 2, wherein said second specified bit resolution is 10 bits, and said first specified bit resolution is 7 bits.

4. An image sensor as in claim 2, wherein said interpolator includes an oversampling element.

5. An image sensor as in claim 2, wherein said interpolator includes and averaging element that removes noise.

6. An image sensor as in claim 2, wherein said interpolator produces at least 16 times oversampling.

7. A sensor as in claim 1, wherein each of said analog to digital converters are 7 bit analog to digital converters.

8. An image sensor comprising:
    a photosensor array having an array of photosensitive pixels;
    at least a plurality of analog to digital converters, each having a digital output having a first specified bit resolution;
    an interpolator, receiving outputs from said analog to digital converters, and producing a digital output having a second specified bit resolution; and
    a noise generator, coupled to said photosensitive pixels.

9. An image sensor as in claim 8, further comprising an analog adder having one input coupled to receive an output of said noise generator and another input coupled to receive an output of said photosensitive array.

10. An image sensor as in claim 9, wherein said analog adder is a node.

11. An image sensor as in claim 8, wherein said noise generator produces noise which includes noise which is an estimate of noise in the system.

12. An image sensor as in claim 2, wherein said interpolator receives M samples and adds said M samples.

13. An image sensor as in claim 8, wherein said noise generator produces noise with an RMS value equal to half of value of a least significant bit of said second specified bit resolution.

14. A semiconductor substrate based comprising:
    a first area of said substrate, holding an array of photosensitive pixels;
    a second area of said substrate, holding a plurality of analog to digital (A/D) converters; and
    a third area of said substrate, holding a digital interpolator, connected to receive outputs of said A/D converters, and producing an output based on said outputs of said A/D converters.

15. A sensor as in claim 14, wherein said second area includes a plurality of 7 bit A/D converters.

16. An image sensor as in claim 14, wherein said digital interpolator includes a summation device.

17. An image sensor as in claim 16, wherein said summation device digitally adds output signals from said A/D converters to previous output signals from said A/D converters.

18. A semiconductor based image sensor, comprising:
    a first area, holding an array of photosensitive pixels;
    a second area, holding a plurality of analog to digital (A/D) converters;
    a third area, holding a digital interpolator, connected to receive outputs of said A/D converters, and producing an output based on said outputs of said A/D converters; and
    a bias input to said digital interpolator.

19. A sensor as in claim 18, wherein said bias input is a DC bias level.

20. A sensor as in claim 18, wherein said bias input includes random noise.

21. A sensor as in claim 14, further comprising adding noise to an output of said array of photosensitive pixels.

22. A sensor as in claim 21, wherein said noise is a representation of noise in the system.

23. A sensor as in claim 21, wherein said noise has an amplitude which is based on a level of a least significant bit of said resolution.

24. An image sensor, comprising:
    an array of photosensitive pixels, each said pixel of said array being adapted to undergo a respective light capture cycle;
    at least one analog to digital (A/D) converter having a specified bit resolution and adapted to receive a plurality of analog input values from one of said pixels during one said respective light capture cycle; and
    an output, having a higher resolution than said specified bit resolution.

25. An image sensor as in claim 24, wherein said A/D converter has 7 bits of resolution, and said output has 10 bits of resolution.

26. An image sensor as in claim 24, further comprising a digital interpolator connected between said A/D converter and said output.

27. An image sensor as in claim 24, wherein there are a plurality of A/D converters, one for each column of the array.

28. An image sensor as in claim 25, wherein said digital interpolator includes a summation device that sums a plurality of outputs from said A/D converter.

29. An image sensor, comprising:
    an array of photosensitive pixels;

at least one analog to digital (A/D) converter having 7 bits of resolution;

an output, having 10 bits of resolution;

a digital interpolator connected between said A/D converter and said output; and a bias input to said digital interpolator which receives a bias signal.

30. An image sensor as in claim 29 wherein said bias signal includes noise.

31. An image sensor as in claim 30, wherein said noise has a level based on a least significant bit of the A/D converter.

32. An image sensor comprising:

a photosensor array having an array of photosensitive pixels;

at least a plurality of analog to digital converters, each having a digital output having a first specified bit resolution and an analog input adapted to receive a plurality of measurements from a single photosensitive pixel of said array during a single sensing cycle of said single pixel; and an interpolator, receiving outputs from said analog to digital converters, and producing a digital output having a second specified bit resolution.

33. A sensor as in claim 32, wherein said second specified bit resolution is larger than said first specified bit resolution.

34. A sensor as in claim 33, wherein said second specified bit resolution is 10 bits, and said first specified bit resolution is a 7 bits.

35. An image sensor as in claim 33, wherein said interpolator includes an oversampling element.

36. An image sensor as in claim 33, wherein said interpolator includes an averaging element that removes noise.

37. An image sensor as in claim 33, wherein said interpolator produces at least 16 times oversampling.

38. An image sensor as in claim 32, wherein each of said plurality of analog to digital converters are 7 bit analog to digital converters.

39. An image sensor as in claim 32, further comprising a noise generator, coupled to said photosensitive pixels.

40. An image sensor as in claim 39, further comprising an analog adder, having one input coupled to receive an output of said noise generator and another input coupled to receive an output of said photosensitive array.

41. An image sensor as in claim 40, wherein said analog adder is a node.

42. An image sensor as in claim 39, wherein said noise includes noise being comparable in magnitude to an estimated value of noise in the system.

43. An image sensor as in claim 33, wherein said interpolator receives M samples and adds said M samples.

* * * * *